United States Patent
Lim et al.

(10) Patent No.: US 9,236,452 B2
(45) Date of Patent: Jan. 12, 2016

(54) RAISED SOURCE/DRAIN EPI WITH SUPPRESSED LATERAL EPI OVERGROWTH

(71) Applicant: GLOBALFOUNDRIES Inc., Grand Cayman (KY)

(72) Inventors: Kwan-Yong Lim, Niskayuna, NY (US); Jody Fronheiser, Delmar, NY (US); Christopher Prindle, Poughkeepsie, NY (US)

(73) Assignee: GLOBALFOUNDRIES INC., Grand-Cayman (KY)

( * ) Notice: Subject to any disclaimer, the term of this patent is extended or adjusted under 35 U.S.C. 154(b) by 27 days.

(21) Appl. No.: 14/286,400

(22) Filed: May 23, 2014

(65) Prior Publication Data

US 2015/0340471 A1 Nov. 26, 2015

(51) Int. Cl.
*H01L 29/66* (2006.01)
*H01L 29/08* (2006.01)

(52) U.S. Cl.
CPC ...... *H01L 29/66795* (2013.01); *H01L 29/0847* (2013.01)

(58) Field of Classification Search
CPC . H01L 21/336; H01L 21/8234; H01L 27/105; H01L 27/12; H01L 29/78
USPC .......... 257/365, 288, 347; 438/297, 283, 230, 438/303
See application file for complete search history.

(56) References Cited

U.S. PATENT DOCUMENTS

| | | | |
|---|---|---|---|
| 2009/0026543 A1* | 1/2009 | Yang | 257/365 |
| 2012/0261756 A1* | 10/2012 | Kanike et al. | 257/350 |
| 2012/0280250 A1* | 11/2012 | Basker et al. | 257/77 |
| 2013/0049115 A1* | 2/2013 | Cheng et al. | 257/347 |
| 2013/0249003 A1* | 9/2013 | Oh et al. | 257/347 |

OTHER PUBLICATIONS

Choi, M. et al. "14nm FinFET Stress Engineering with Epitaxial SiGe Source/Drain" IEEE, Synopsys, Inc. 2012, 2 pages.

* cited by examiner

*Primary Examiner* — Sheng Zhu
(74) *Attorney, Agent, or Firm* — Ditthavong & Steiner, P.C.

(57) ABSTRACT

A method of forming raised S/D regions by partial EPI growth with a partial EPI liner therebetween and the resulting device are provided. Embodiments include forming groups of fins extending above a STI layer; forming a gate over the groups of fins; forming a gate spacer on each side of the gate; forming a raised S/D region proximate to each spacer on each fin of the groups of fins, each raised S/D region having a top surface, vertical sidewalls, and an undersurface; forming a liner over and between each raised S/D region; removing the liner from the top surface of each raised S/D region and from in between a group of fins; forming an overgrowth region on the top surface of each raised S/D region; forming an ILD over and between the raised S/D regions; and forming a contact through the ILD, down to the raised S/D regions.

15 Claims, 14 Drawing Sheets

FIG. 1B

BACKGROUND ART

FIG. 1A

BACKGROUND ART

FIG. 2B

BACKGROUND ART

FIG. 2A

BACKGROUND ART

BACKGROUND ART

FIG. 4A

BACKGROUND ART

RAISED SOURCE/DRAIN EPI WITH SUPPRESSED LATERAL EPI OVERGROWTH

TECHNICAL FIELD

The present disclosure relates to forming raised source/drain (S/D) regions by epitaxial (EPI) growth for fin-type field-effect transistor (FinFET) devices. The present disclosure is particularly applicable to 10 nanometer (nm) technology nodes and beyond.

BACKGROUND

A known approach for forming raised S/D regions by EPI growth for FinFet devices is illustrated in FIGS. 1A through 4A and 1B through 4B, with FIGS. 1B through 4B showing cross-sectional views of FIGS. 1A through 4A along cut-lines 1B-1B' through 4B-4B', respectively. Adverting to FIGS. 1A and 1B, a plurality of fins 101 are formed on a substrate 103, the fins 101 extending above a shallow trench isolation (STI) layer 105. Next, a dummy polysilicon (poly) gate 201 and a gate hardmask 203, e.g., of silicon nitride (SiN), are formed over the fins 101 and the STI layer 105, as depicted in FIGS. 2A and 2B. Thereafter, gate spacers 301 are formed on each side of the gate 201 and the hard mask 203, as illustrated in FIGS. 3A and 3B. Adverting to FIGS. 4A and 4B, raised S/D regions 401 are formed by EPI growth in a sharp diamond shape on each of the fins 101. Thereafter, although not shown for illustrative convenience, an interlayer dielectric (ILD) layer is formed, the dummy poly gate 201 is removed, a replacement metal gate (RMG) is formed, the ILD is etched, forming a trench, and then a contact is formed in the trench, down to the raised S/D regions 401.

However, an integrated circuit may include both dense narrow Fin pitch devices, as depicted in FIGS. 1A through 4A, as well as isolated single Fin devices. During formation of raised S/D regions by EPI growth, two neighboring narrow Fin pitch raised S/D regions 401 can become merged. Over the merged S/D regions, EPI growth continues in the vertical direction, whereas EPI overgrowth occurs along the angled S/D surfaces for isolated single Fin devices. The EPI-growth rate occurs much faster in the vertical direction than along the S/D surfaces. Consequently, dense narrow pitch FinFet devices will show higher EPI overgrowth than isolated single Fin devices, which can cause contact issues, e.g., threshold voltage mismatch (VTMM).

A need therefore exists for methodology enabling uniform formation of raised S/D regions by EPI growth among both dense narrow Fin pitches and isolated single Fin pitches, with no merged raised S/D regions, and the resulting device.

SUMMARY

An aspect of the present disclosure is a method of forming raised S/D regions by partial EPI growth and forming a partial EPI liner therebetween.

Another aspect of the present disclosure is a device including raised S/D EPI regions formed by partial EPI growth and a partial EPI liner formed therebetween.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first group and a second group of fins extending above a STI layer; forming a gate over the first and second groups of fins; forming a gate spacer on each side of the gate; forming a raised S/D region proximate to each spacer on each fin of the first and second groups of fins, each raised S/D region having a top surface, vertical sidewalls, and an undersurface; forming a liner over and between each raised S/D region; removing the liner from the top surface of each raised S/D region and from in between the second group of fins; forming an overgrowth region on the top surface of each raised S/D region; forming an ILD over and between the raised S/D regions; and forming a contact through the ILD, down to the raised S/D regions.

Aspects of the present disclosure include forming the first group of fins with a narrow fin pitch relative to the second group of fins. Other aspects include forming the raised S/D region by partial epitaxial growth, wherein the sidewalls have a vertical plane greater than or equal to 5 nm in length. Further aspects include forming the raised S/D region of silicon germanium (SiGe), silicon phosphorous (SiP), silicon carbon phosphorous (SiCP), or silicon carbon boron (SiCB). Another aspect includes forming the raised S/D region at a temperature of 500° C. to 800° C. Additional aspects include forming the raised S/D region for 0.5 minutes to 60 minutes. Other aspects include forming the raised S/D region at a pressure of 1 Torr to 500 Torr. Further aspects include forming the liner to a thickness of 25 angstroms (Å) to 150 Å. Another aspect includes forming the liner of silicon nitride (SiN), silicon dioxide ($SiO_2$), aluminum oxide ($Al_2O_3$), hafnium oxide ($HfO_2$), silicon oxynitride (SiON), silicon-carbon-boron-nitrogen (SiCBN), silicon-carbon-oxynitride (SiCON), silicon carbon nitride (SiCN), or silicon boron nitride (SiBN). Additional aspects include removing the liner by dry or wet etching. Other aspects include forming the overgrowth region by epitaxial growth. Further aspects include forming the overgrowth region to a thickness of 20 Å to 300 Å. Another aspect includes forming the overgrowth region of one or more layers of Si, SiGe, and/or silicon carbide (SiC). Additional aspects include replacing the gate with a RMG prior to forming the contact by: forming a poly dummy gate over the first and second group of fins; forming a gate hard mask layer on top of the poly dummy gate; forming the gate spacer on each side of the poly dummy gate; forming the ILD layer over and between the raised S/D regions; removing the poly dummy gate, forming a trench between the gate spacers; forming the replacement metal gate in the trench.

Another aspect of the present disclosure is a device including: a plurality of fins formed on a substrate; a shallow trench isolation layer formed on the substrate between the plurality of fins; a gate formed over the plurality of fins; a gate spacer formed adjacent to each side of the gate; a raised S/D region formed on each of the plurality of fins proximate to each spacer, each raised S/D region having a top surface and vertical sidewalls; a liner formed on the sidewalls of each raised S/D region; an overgrowth region formed on the top surface of each raised S/D region; an ILD formed over and between the raised S/D regions; and a contact formed through the ILD down to the raised S/D regions.

Aspects of the device include the raised S/D region being formed by partial EPI growth and the sidewalls having a vertical plane greater than or equal to 5 nm in length. Other aspects include the raised S/D region being formed of SiGe, SiP, SiCP, or SiCB. Further aspects include the liner being formed of SiN, $SiO_2$, $Al_2O_3$, $HfO_2$, SiON, SiCBN, SiCON, SiCN, or SiBN. Another aspect includes the overgrowth region being formed by EPI growth of one or more layers of Si, SiGe, and/or SiC.

A further aspect of the present disclosure is a method including: forming a first group and a second group of fins above an STI layer; forming a gate over the first and second group of fins; forming a gate spacer on each side of the gate; forming a raised S/D region proximate to each spacer on each fin of the first and second groups of fins by partial epitaxial growth, the S/D region having a top surface, vertical sidewalls, and an undersurface, and wherein the sidewalls have a vertical plane greater than or equal to 5 nm in length; forming a liner to a thickness of 25 Å to 150 Å over and between each raised S/D region; etching the liner from the top surface of each raised S/D region and from in between the second group of fins; forming an epitaxial overgrowth region to a thickness of 20 Å to 300 Å on the top surface of each raised S/D region; forming an ILD layer over and between the raised S/D regions; and forming a contact between the ILD, down to the raised S/D regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 4A and 1B through 4B schematically illustrate sequential steps of a background method of forming raised S/D regions by EPI growth for a FinFet device, with FIGS. 1B through 4B showing cross-sectional views of FIGS. 1A through 4A along cut-lines 1B-1B' through 4B-4B', respectively; and FIGS. 5A through 14A and 5B through 14B schematically illustrate sequential steps of a method of forming raised S/D regions by partial EPI growth and forming a partial EPI liner therebetween, in accordance with an exemplary embodiment, with FIGS. 5B through 14B showing cross-sectional views of FIGS. 5A through 14A along cut-lines 5B-5B' through 14B-14B', respectively.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of neighboring narrow Fin pitch device EPI layers merging together, causing non-uniform EPI overgrowth and resulting contact issues, e.g., VTMM, attendant upon forming raised S/D regions by EPI growth among both dense narrow Fin pitch devices and isolated Fin devices.

Methodology in accordance with embodiments of the present disclosure includes forming a first group and a second group of fins extending above a STI layer. A gate is formed over the first and second groups of fins. A gate spacer is formed on each side of the gate. A raised S/D region is formed proximate to each spacer on each fin of the first and second groups of fins, each raised S/D region having a top surface, vertical sidewalls, and an undersurface. A liner is formed over and between each raised S/D region. The liner is removed from the top surface of each raised S/D region and from in between the second group of fins. An overgrowth region is formed on the top surface of each raised S/D region. An ILD is formed over and between the raised S/D regions. A contact is formed through the ILD, down to the raised S/D regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
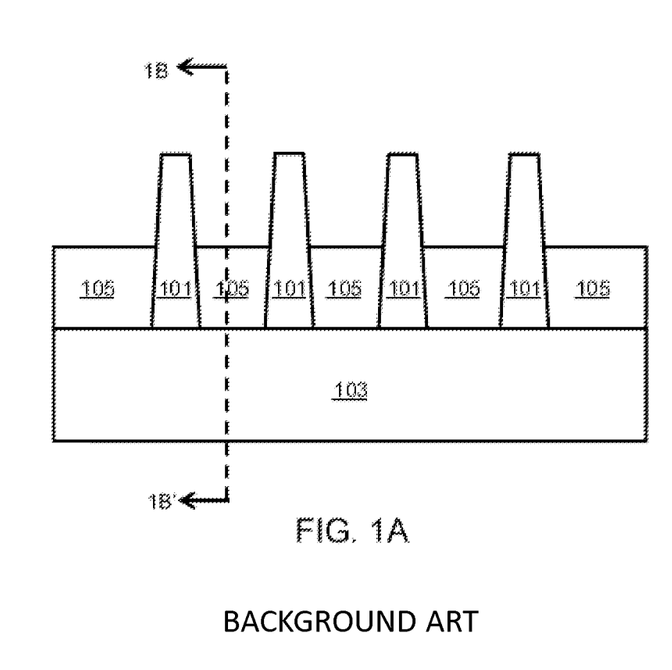
Figure 1B:
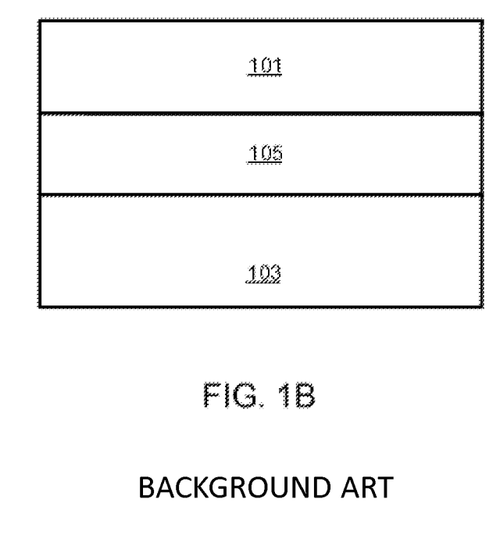
Figure 2A:
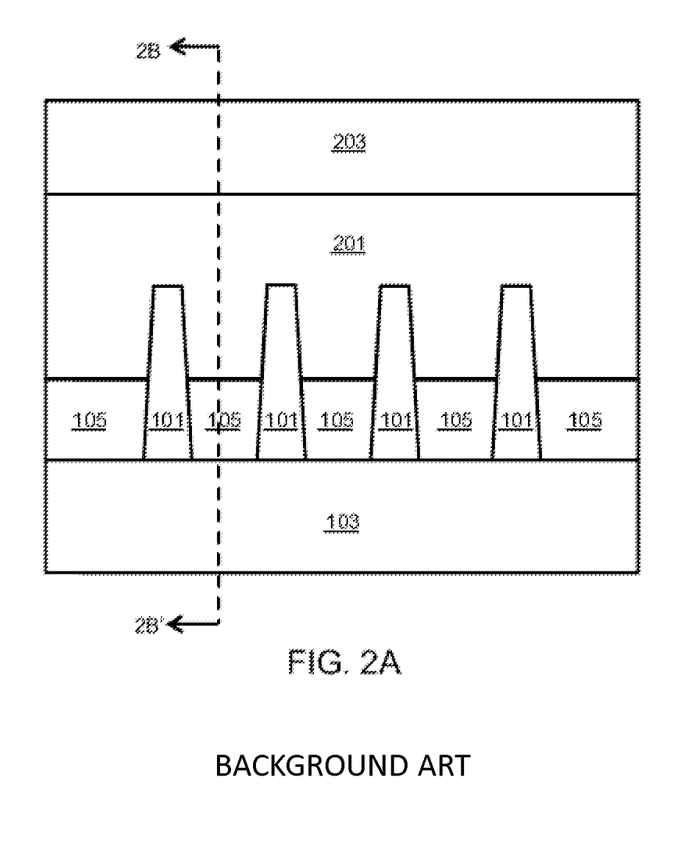
Figure 2B:
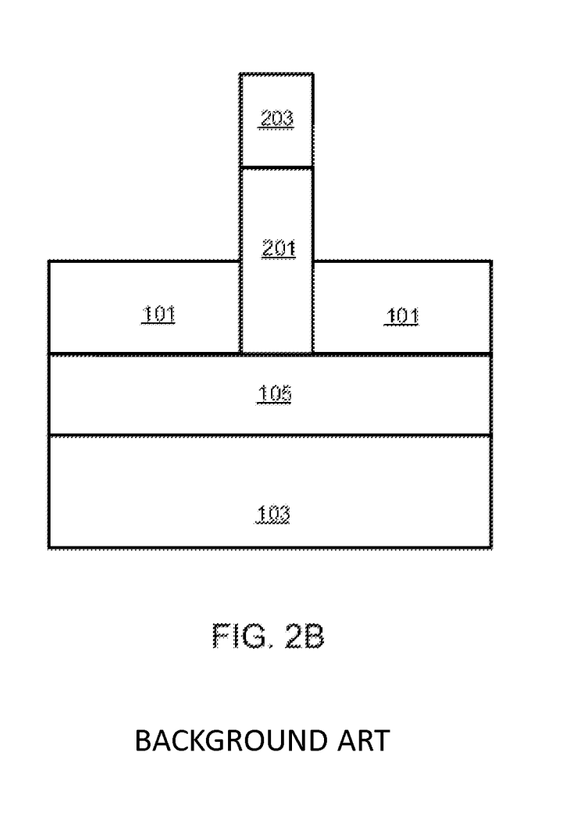
Figure 3A:
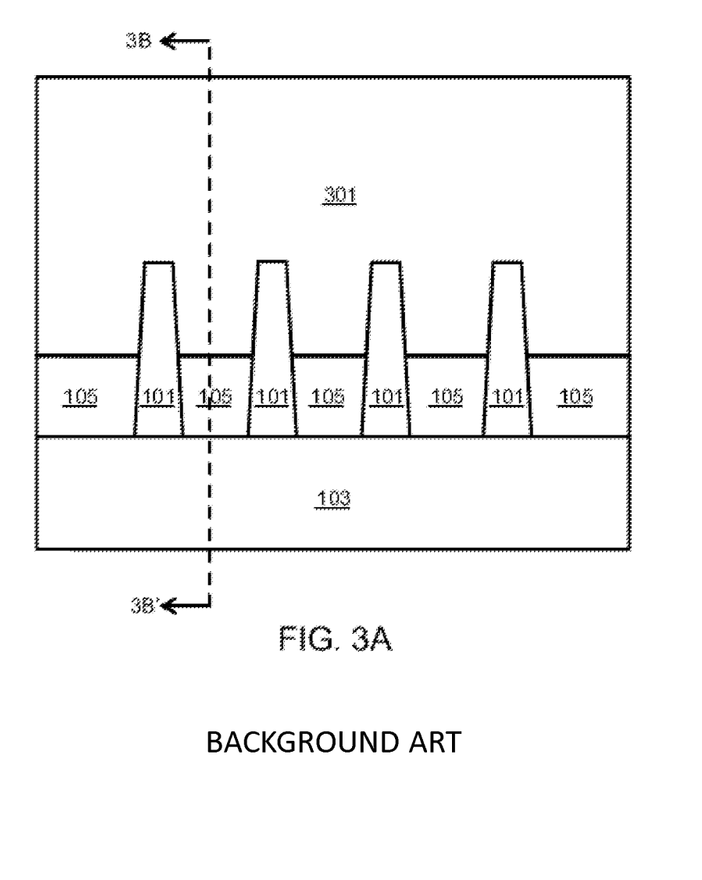
Figure 3B:
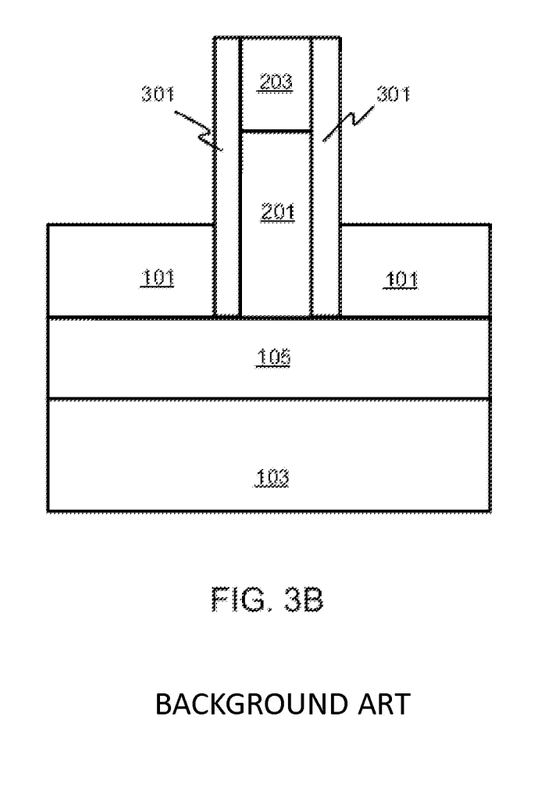
Figure 4A:
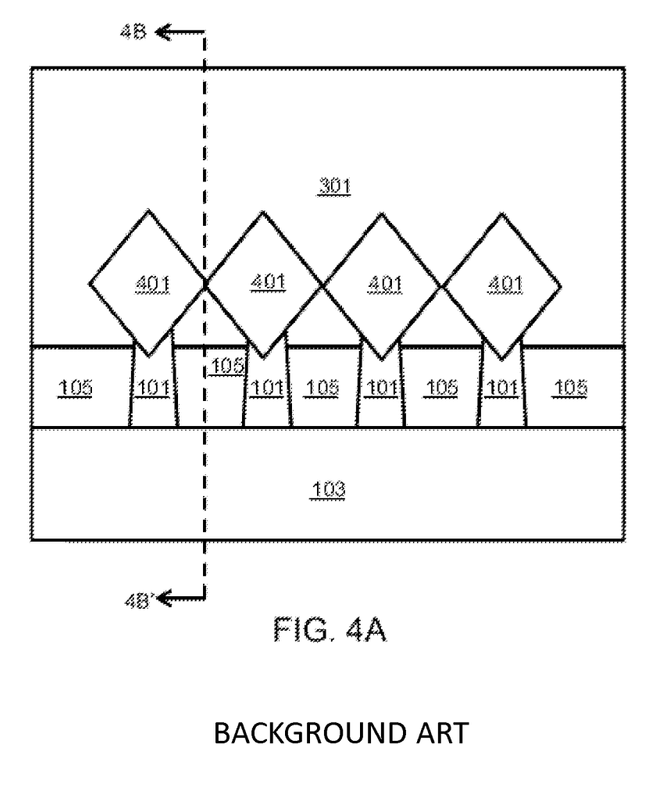
Figure 4B:
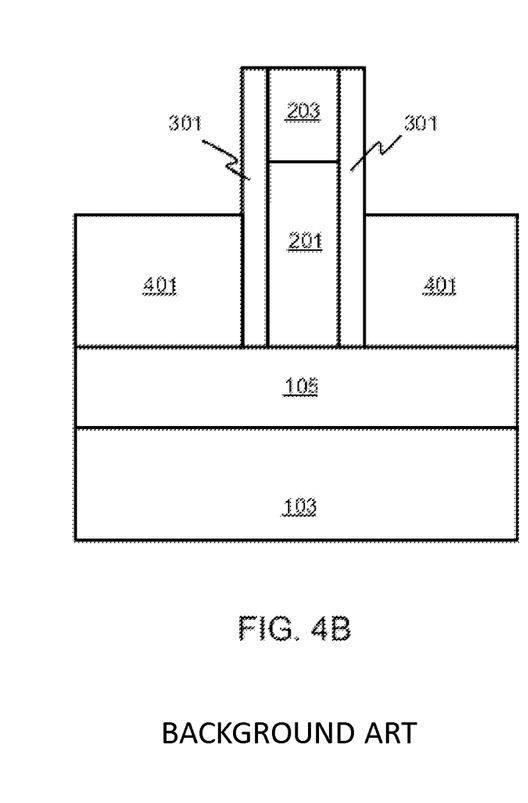
Figure 5A:
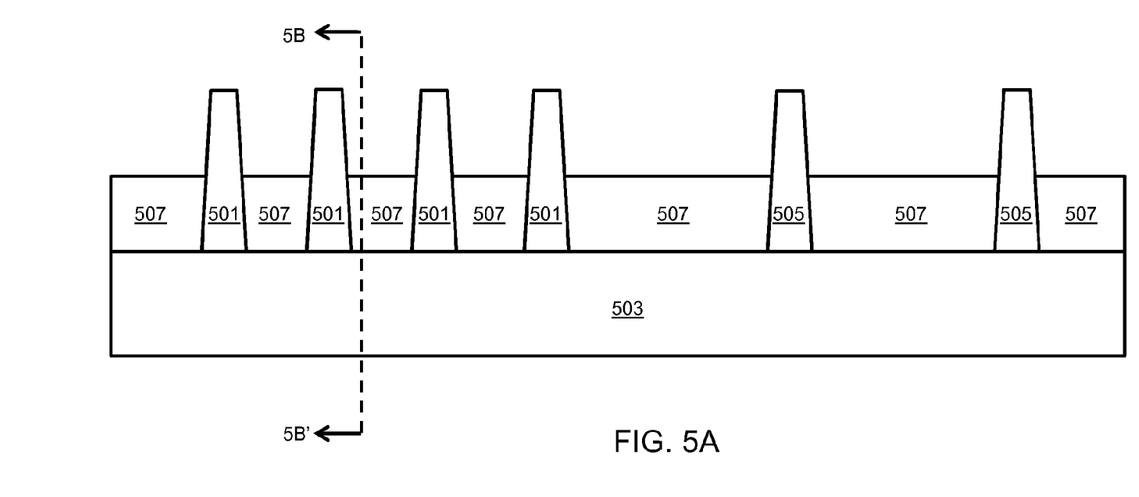
Figure 5B:
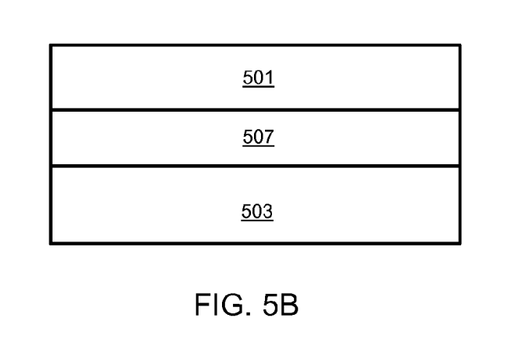
Figure 6A:
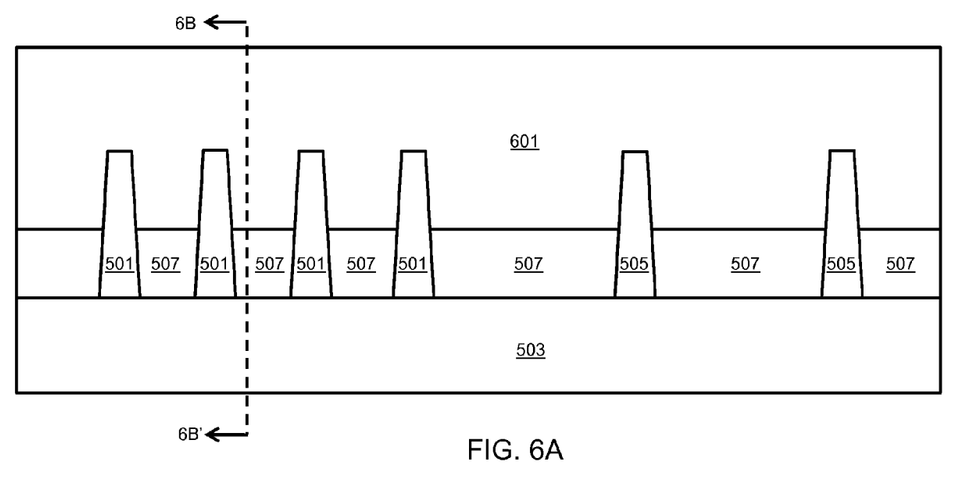
Figure 6B:
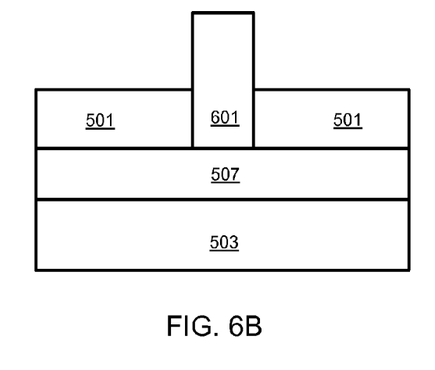
Figure 7A:
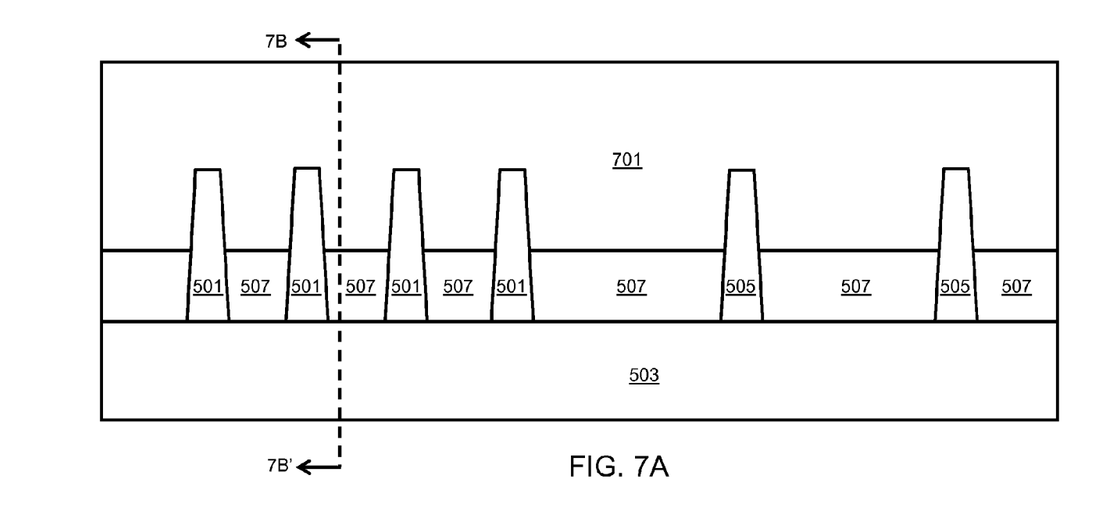
Figure 7B:
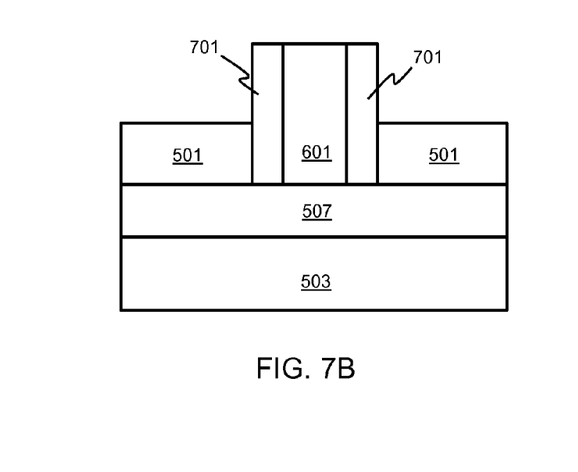

Adverting to FIGS. 5A and 5B, a group of fins 501 are formed on a substrate 503 with a narrow fin pitch and a group of isolated fins 505 are also formed on the substrate 503. The fins 501 and 505 extend above an STI layer 507. Next, a gate 601 is formed over the fins 501 and 505, as depicted in FIGS. 6A and 6B. Alternatively, the gate 601 may be formed by an RMG process as discussed with respect to FIGS. 1A through 4A. Gate spacers 701 are then formed on each side of the gate 601, as depicted in FIGS. 7A and 7B.

Figure 8A:
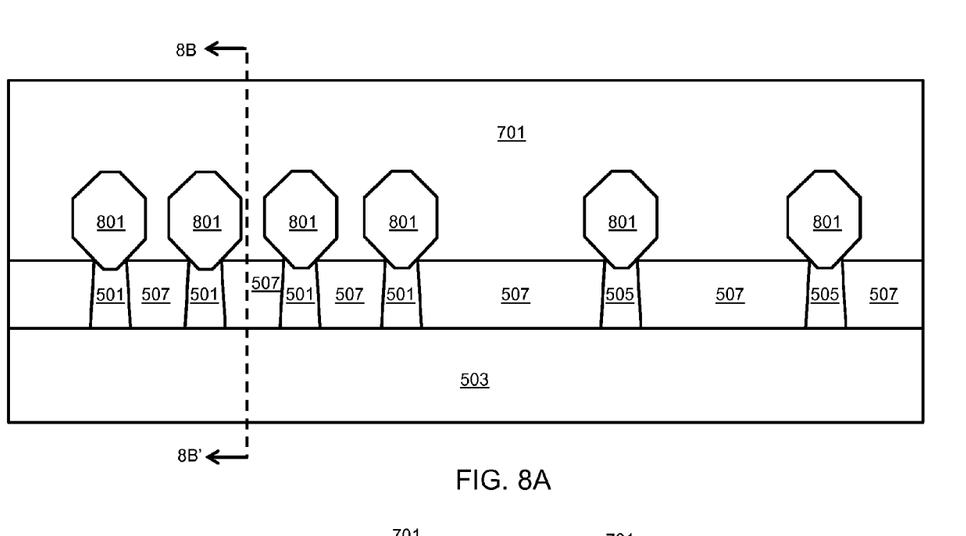
Figure 8B:
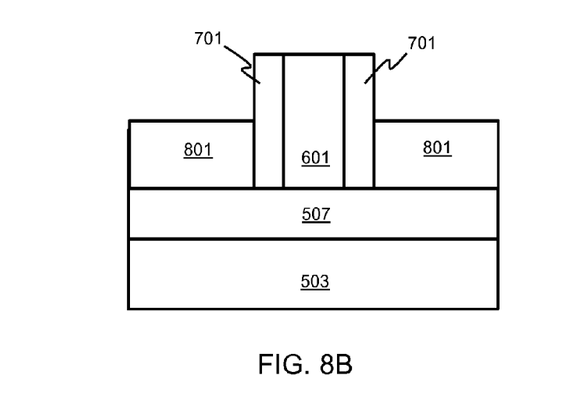
Figure 9A:
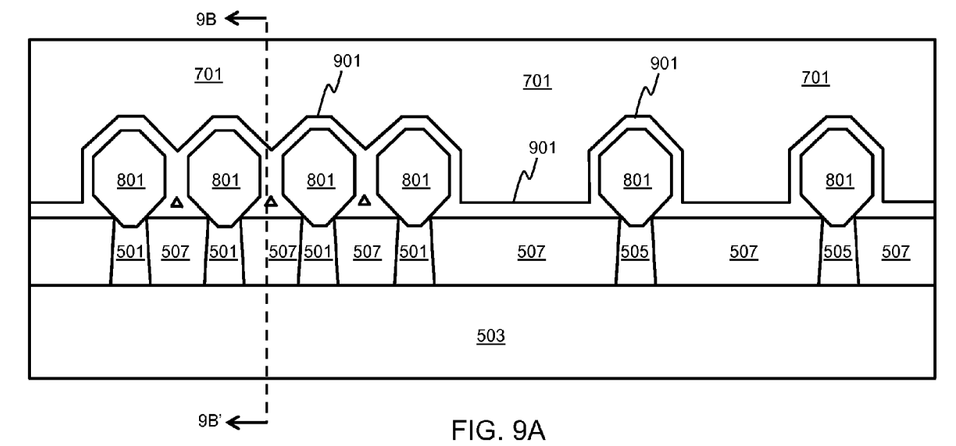
Figure 10A:
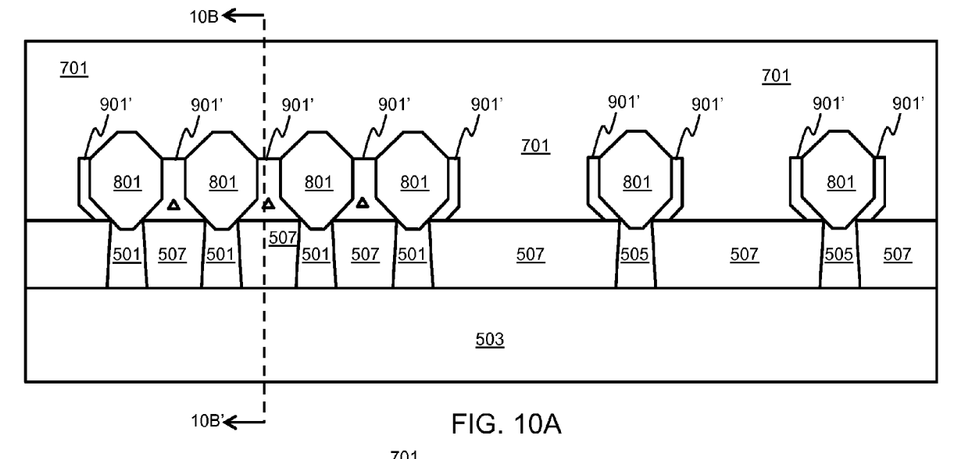

Adverting to FIGS. 8A and 8B, a raised S/D region 801 is formed proximate to each gate spacer 701 on each of the fins 501 and 505 by partial EPI growth. Each raised S/D region 801 has a top surface, vertical sidewalls, and an undersurface. The vertical sidewalls of each raised S/D region 801 may have a vertical plane greater than or equal to 5 nm in length. Moreover, the raised S/D regions 801 may be formed, for example, of SiGe, SiP, SiCP, or SiCB. The partial EPI growth may be performed, for example, at a temperature of 500° C. to 800° C. for 0.5 minutes to 60 minutes and at 1 Torr to 500 Torr. Next, an EPI liner 901 is formed, for example of SiN, SiO2, Al2O3, HfO2, SiON, SiCBN, SiCON, SiCN, or SiBN, e.g SiN or SiO2, over and between the raised S/D regions 801, as depicted in FIGS. 9A and 9B. The EPI liner 901 may be formed, for example, to a thickness of 25 Å to 150 Å. The EPI liner 901 functions as a gap-fill between the fins 501. Thereafter, the EPI liner 901 is removed from the top surface of each raised S/D region 801 and from in between the fins 505 by dry or wet etching, for example, thereby forming EPI liner 901', as depicted in FIGS. 10A and 10B. To form the EPI liner 901', the EPI liner 901 may be etched at a temperature of 0° C. to 300° C. and at pressure of 1 millitorr (mTorr) to 500 mTorr. The EPI liner 901' between the raised S/D regions on the narrow Fin pitch fins can prevent merging of EPI layers during subsequent EPI overgrowth formation.

Figure 11A:
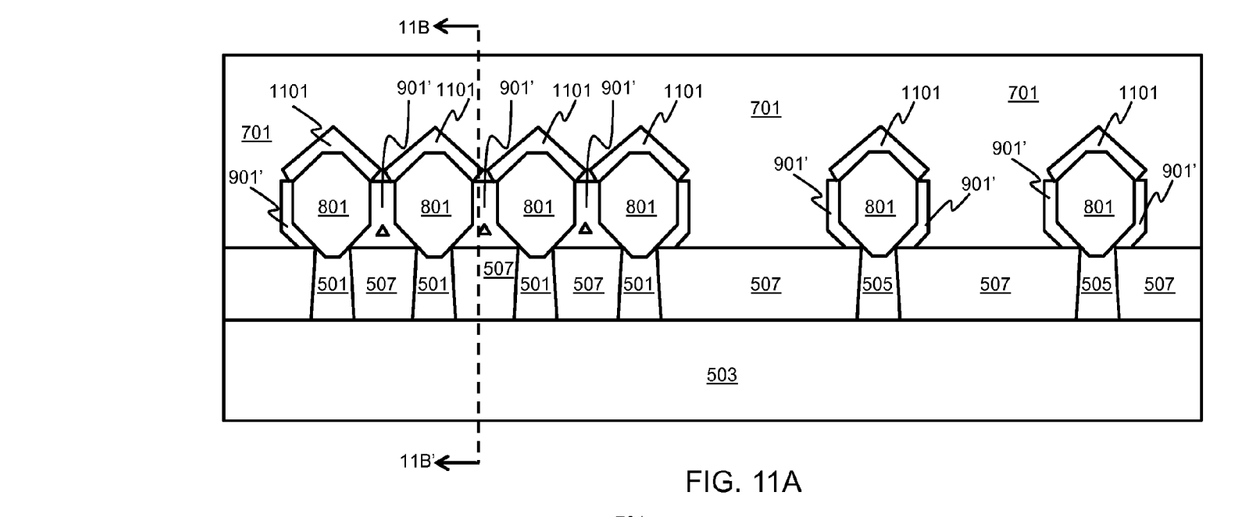
Figure 11B:
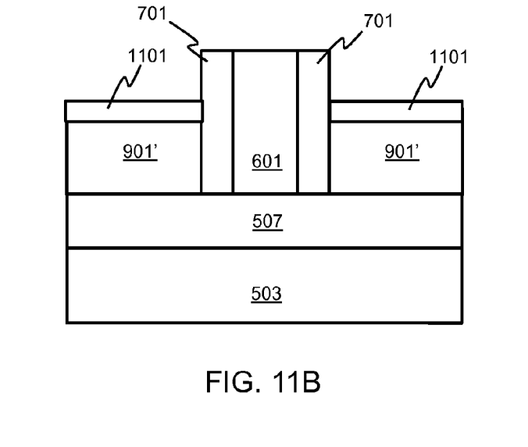
Figure 12A:
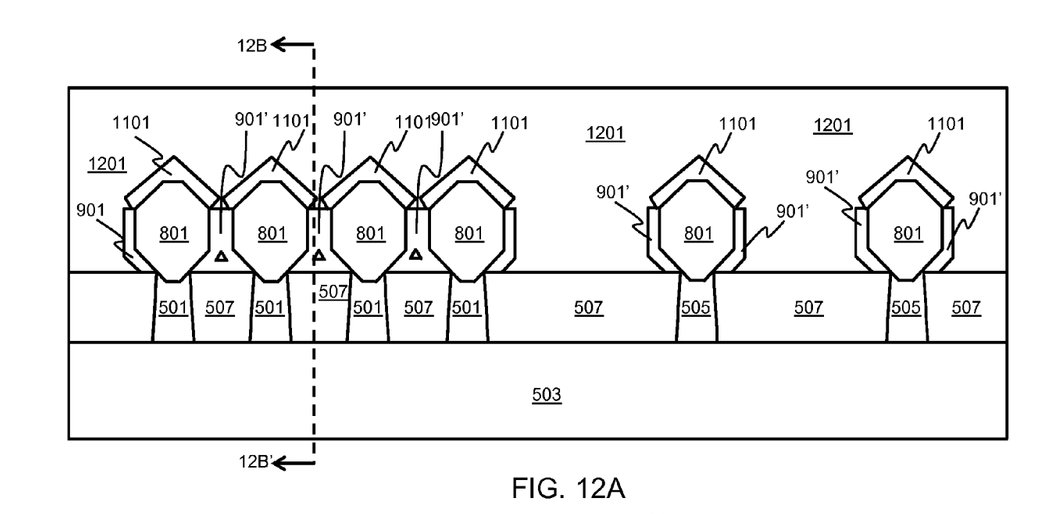
Figure 12B:
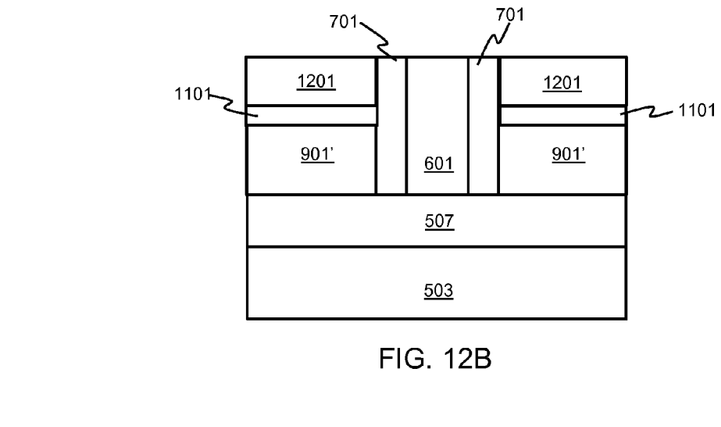
Figure 13A:
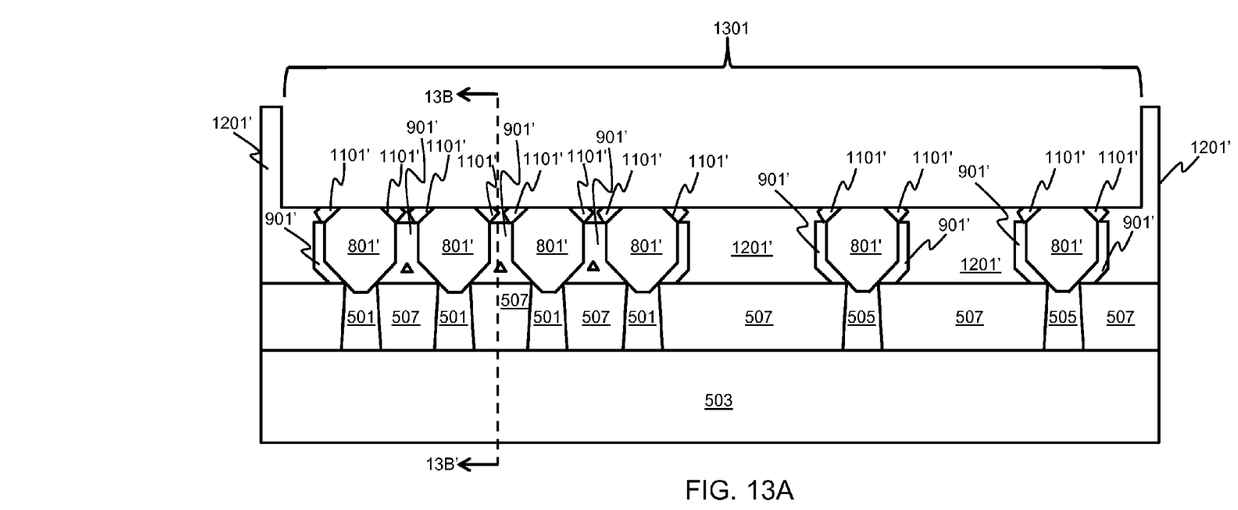
Figure 13B:
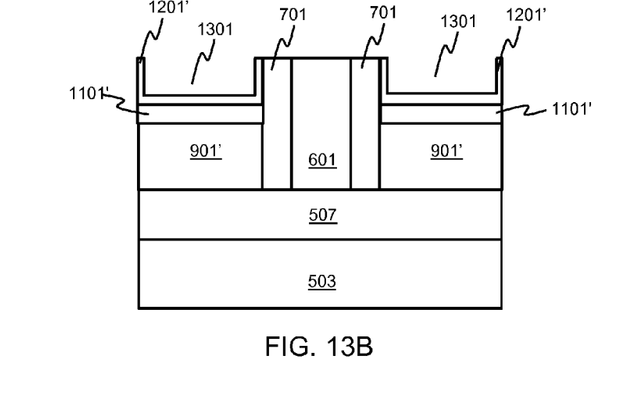
Figure 14A:
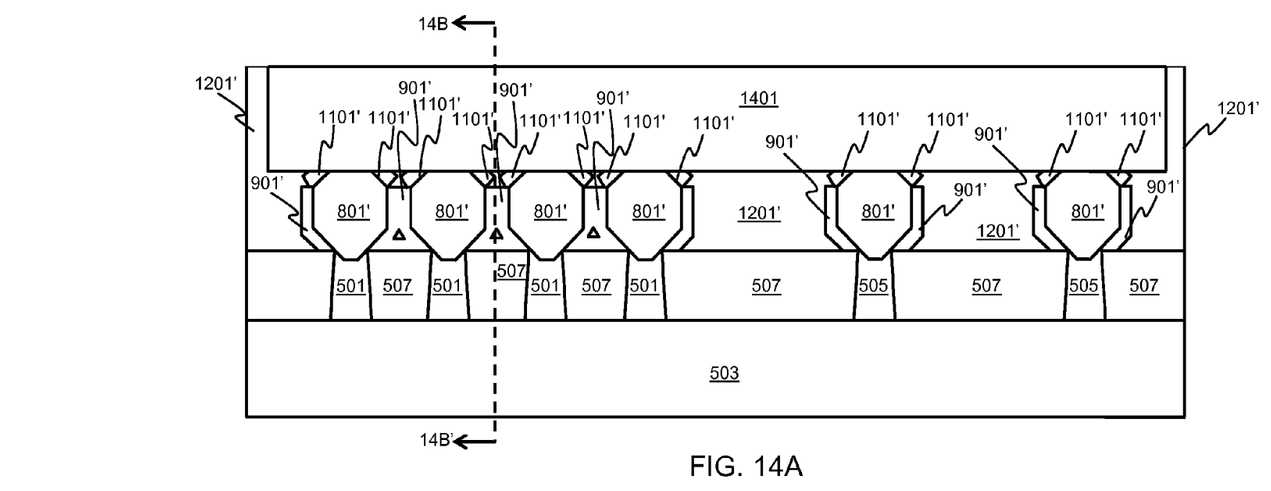
Figure 14B:
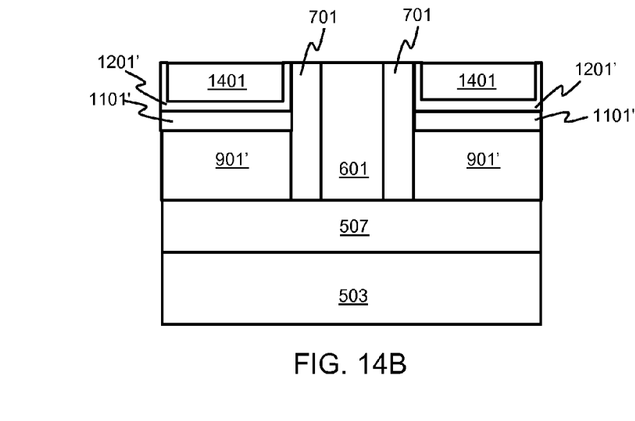

Adverting to FIGS. 11A and 11B, an overgrowth region 1101 is formed by EPI growth on the top surface of each raised S/D region 801. The overgrowth region 1101 may be formed, for example, of one or more layers of Si, SiGe and/or SiC. In addition, the overgrowth region 1101 may be formed, for example, to a thickness of 20 Å to 300 Å. Next, an ILD 1201 is formed over and between the raised S/D regions 801, as depicted in FIGS. 12A and 12B. Thereafter, a trench 1301 is formed through the ILD 1201, the overgrowth region 1101, and the partially raised S/D regions 801, forming ILD 1201', overgrowth region 1101', and raised S/D regions 801', as depicted in FIGS. 13A and 13B. Adverting to FIGS. 14A and 14B, a contact 1401 is then formed in the trench 1301, down to the raised S/D regions 801'.

Although not depicted for illustrative convenience, in the alternative embodiment wherein the gate is formed by a RMG process, a poly dummy gate is formed over the fins 501 and 505. The process continues as described above through the formation of the ILD 1201. Next, the poly dummy gate is removed, forming a trench between the gate spacers 701, and the RMG is formed in the trench. Then, the process proceeds as described above with forming the contact, as depicted in FIGS. 13A through 14A.

The embodiments of the present disclosure can achieve several technical effects including forming uniform EPI overgrowth among very narrow Fin pitch devices and isolated Fin pitch devices, forming uniform contacts, which in turn provides uniform device characteristics that can improve VTMM, for example, and including encapsulation of the sidewalls and bottom of the raised S/D regions with a partial EPI liner, preventing silicide formation at those regions, which in turn prevents junction leakage issues. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure is particularly applicable to 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a first group and a second group of fins extending above a shallow trench isolation (STI) layer, the STI layer surrounding at least a portion of the first group and second group of fins;
    forming a gate over the first and second groups of fins;
    forming a gate spacer on each side of the gate;
    subsequent to forming the gate spacer on each side of the gate, forming a raised source/drain (S/D) region proximate to each spacer on each fin of the first and second groups of fins, each raised S/D region having a top surface, vertical sidewalls, and an undersurface;
    forming a liner atop and between each raised S/D region;
    removing the liner from the top surface of each raised S/D region and from in between the second group of fins;
    subsequent to removing the liner, forming an overgrowth region on the top surface of each raised S/D region;
    subsequent to forming the overgrowth region on the top surface of each raised S/D region, forming an interlayer dielectric (ILD) over and between the raised S/D regions; and
    forming a contact through the ILD, down to the raised S/D regions.

2. The method according to claim 1, comprising forming the first group of fins with a narrow fin pitch relative to the second group of fins.

3. The method according to claim 1, comprising forming the raised S/D region by partial epitaxial growth, wherein the sidewalls have a vertical plane greater than or equal to 5 nanometers (nm) in length.

4. The method according to claim 3, comprising forming the raised S/D region of silicon germanium (SiGe), silicon phosphorous (SiP), silicon carbon phosphorous (SiCP), or silicon carbon boron (SiCB).

5. The method according to claim 3, comprising forming the raised S/D region at a temperature of 500° C. to 800° C.

6. The method according to claim 3, comprising forming the raised S/D region for 0.5 minutes to 60 minutes.

7. The method according to claim 3, comprising forming the raised S/D region at a pressure of 1 Torr to 500 Torr.

8. The method according to claim 1, comprising forming the liner to a thickness of 25 angstroms (Å) to 150 Å.

9. The method according to claim 8, comprising forming the liner of silicon nitride (SiN), silicon dioxide ($SiO_2$), aluminum oxide ($Al_2O_3$), hafnium oxide ($HfO_2$), silicon oxynitride (SiON), silicon-carbon-boron-nitrogen (SiCBN), silicon-carbon-oxynitride (SiCON), silicon carbon nitride (SiCN), or silicon boron nitride (SiBN).

10. The method according to claim 1, comprising removing the liner by dry or wet etching.

11. The method according to claim 1, comprising forming the overgrowth region by epitaxial growth.

12. The method according to claim 11, comprising forming the overgrowth region to a thickness of 20 Å to 300 Å.

13. The method according to claim 1, comprising forming the overgrowth region of one or more layers of Si, silicon germanium (SiGe), and/or silicon carbide (SiC).

14. The method according to claim 1, further comprising replacing the gate with a replacement metal gate (RMG) prior to forming the contact by:
    forming a polysilicon (poly) dummy gate over the first and second group of fins;
    forming a gate hard mask layer on top of the poly dummy gate;
    forming the gate spacer on each side of the poly dummy gate;
    forming the ILD layer over and between the raised S/D regions;
    removing the poly dummy gate, forming a trench between the gate spacers;
    forming the replacement metal gate in the trench.

15. A method comprising:
    forming a first group and a second group of fins above a shallow trench isolation (STI) layer, the STI layer surrounding at least a portion of the first group and second group of fins;
    forming a gate over the first and second group of fins;
    forming a gate spacer on each side of the gate;
    subsequent to forming the gate spacer on each side of the gate, forming a raised source/drain (S/D) region proximate to each spacer on each fin of the first and second groups of fins by partial epitaxial growth, the S/D region having a top surface, vertical sidewalls, and an undersurface, and wherein the sidewalls have a vertical plane greater than or equal to 5 nanometers (nm) in length;
forming a liner to a thickness of 25 angstroms (Å) to 150 Å atop and between each raised S/D region;
etching the liner from the top surface of each raised S/D region and from in between the second group of fins;
subsequent to etching the liner, forming an epitaxial overgrowth region to a thickness of 20 Å to 300 Å on the top surface of each raised S/D region;
subsequent to forming the epitaxial overgrowth region on the top surface of each raised S/D region, forming an interlayer dielectric (ILD) layer over and between the raised S/D regions; and
forming a contact between the ILD, down to the raised S/D regions.

* * * * *